(12) United States Patent
Wang et al.

(10) Patent No.: US 9,038,883 B2
(45) Date of Patent: May 26, 2015

(54) VCSEL PACKAGING

(71) Applicant: Princeton Optronics Inc., Mercerville, NJ (US)

(72) Inventors: Qing Wang, Plainsboro, NJ (US); Jean-Francois Seurin, Princeton Junction, NJ (US); Chuni Lal Ghosh, West Windsor, NJ (US); Laurence Watkins, Pennington, NJ (US)

(73) Assignee: Princeton Optronics Inc., Mercerville, NJ (US)

( * ) Notice: Subject to any disclaimer, the term of this patent is extended or adjusted under 35 U.S.C. 154(b) by 0 days.

(21) Appl. No.: 14/479,325

(22) Filed: Sep. 7, 2014

(65) Prior Publication Data

US 2015/0069113 A1    Mar. 12, 2015

Related U.S. Application Data

(60) Provisional application No. 61/876,302, filed on Sep. 11, 2013.

(51) Int. Cl.
| | |
|---|---|
| *B23K 31/02* | (2006.01) |
| *H01S 5/022* | (2006.01) |
| *H01S 5/00* | (2006.01) |
| *B23K 1/00* | (2006.01) |

(52) U.S. Cl.
CPC ........... *H01S 5/02272* (2013.01); *H01S 5/0042* (2013.01); *B23K 1/0016* (2013.01); *B23K 2001/12* (2013.01)

(58) Field of Classification Search
None
See application file for complete search history.

(56) References Cited

U.S. PATENT DOCUMENTS

| | | | |
|---|---|---|---|
| 4,921,157 A | 5/1990 | Dishon et al. | |
| 5,031,187 A | 7/1991 | Orenstein | |
| 5,325,386 A | 6/1994 | Jewell et al. | |
| 5,500,540 A | 3/1996 | Jewell et al. | |
| 5,662,763 A * | 9/1997 | Yamanaka | 156/358 |
| 5,708,280 A | 1/1998 | Lebby et al. | |
| 5,821,571 A | 10/1998 | Lebby et al. | |
| 5,905,750 A | 5/1999 | Lebby et al. | |
| 5,977,567 A | 11/1999 | Verdiell | |

(Continued)

OTHER PUBLICATIONS

Angelique Risson and Jean-Claude Mollier, The Vertical-Cavity Surface Emitting Laser (VCSEL) and Electrical Access Contribution, Optoelectronics—Devices and Applications, Prof. P. Predeep (Ed.), ISBN: 978-953-307-576-1, InTech, Available from: http://www.intechopen.com/books/optoelectronics-devices-andapplications/the-vertical-cavity-surface-emitting-laser-vcsel-and-electrical-access-contribution, 2011.

(Continued)

*Primary Examiner* — Kiley Stoner
(74) *Attorney, Agent, or Firm* — Sonali Banerjee

(57) ABSTRACT

A process to bond VCSEL arrays to submounts and printed circuit boards is provided. The process is particularly suited to large area thin and ultra-thin VCSEL arrays susceptible to bending and warping. The process integrates a flatness measurement step and applying appropriate combination of pressure prior to bonding the VCSEL array to the submount or a printed circuit using a vacuum flux-less bonding process. The process is very promising in making very good quality bonding between the VCSEL array and a submount or a printed circuit board. The process is applied to construct optical modules with improved flatness that may be integrated with other electronic components in constructing optoelectronic systems.

28 Claims, 12 Drawing Sheets

(56) References Cited

U.S. PATENT DOCUMENTS

| | | | |
|---|---|---|---|
| 5,978,401 A | 11/1999 | Morgan | |
| 5,978,408 A | 11/1999 | Thornton | |
| 5,984,165 A * | 11/1999 | Inoue et al. | 228/180.22 |
| 6,056,448 A | 5/2000 | Sauter et al. | |
| 6,208,681 B1 | 3/2001 | Thornton | |
| 6,297,068 B1 | 10/2001 | Thornton | |
| 6,458,411 B1 * | 10/2002 | Goossen et al. | 427/123 |
| 6,601,753 B2 | 8/2003 | Baker et al. | |
| 6,759,687 B1 * | 7/2004 | Miller et al. | 257/98 |
| 6,816,523 B1 | 11/2004 | Glenn et al. | |
| 6,853,007 B2 | 2/2005 | Tatum et al. | |
| 6,922,496 B2 | 7/2005 | Morris | |
| 6,953,291 B2 | 10/2005 | Liu | |
| 6,975,514 B2 | 12/2005 | Morris | |
| 7,049,704 B2 | 5/2006 | Chakravorty et al. | |
| 7,637,413 B2 * | 12/2009 | Hiramatsu et al. | 228/103 |
| 7,793,817 B2 * | 9/2010 | Okamoto et al. | 228/102 |
| 8,107,326 B1 * | 1/2012 | Hirano et al. | 369/13.33 |
| 8,139,448 B1 * | 3/2012 | Hirano et al. | 369/13.33 |
| 8,184,507 B1 * | 5/2012 | Hirano et al. | 369/13.33 |
| 8,247,252 B2 | 8/2012 | Gauggel et al. | |
| 8,537,874 B2 | 9/2013 | Wang et al. | |
| 8,654,811 B2 | 2/2014 | Geske et al. | |
| 2003/0053510 A1 * | 3/2003 | Yuen et al. | 372/96 |
| 2004/0218875 A1 * | 11/2004 | Lemoff et al. | 385/89 |
| 2005/0089264 A1 * | 4/2005 | Johnson et al. | 385/15 |
| 2005/0105860 A1 * | 5/2005 | Oono et al. | 385/88 |
| 2007/0251981 A1 * | 11/2007 | Chapman et al. | 228/214 |
| 2007/0284414 A1 * | 12/2007 | Kopp et al. | 228/101 |
| 2009/0001140 A1 * | 1/2009 | Katayama et al. | 228/212 |
| 2009/0104565 A1 * | 4/2009 | Nakashiba et al. | 430/312 |
| 2009/0184152 A1 * | 7/2009 | Kimbara | 228/111 |
| 2009/0289101 A1 * | 11/2009 | Du et al. | 228/180.22 |
| 2010/0252167 A1 * | 10/2010 | Ferrari et al. | 156/60 |
| 2011/0064363 A1 * | 3/2011 | Steijer et al. | 385/88 |
| 2011/0206379 A1 | 8/2011 | Budd et al. | |
| 2012/0051685 A1 * | 3/2012 | Su et al. | 385/14 |
| 2012/0099407 A1 * | 4/2012 | Hipwell et al. | 369/13.32 |
| 2012/0138665 A1 * | 6/2012 | Oka | 228/125 |
| 2013/0102112 A1 * | 4/2013 | Chen et al. | 438/118 |
| 2013/0286614 A1 * | 10/2013 | Tan et al. | 361/764 |
| 2013/0343418 A1 | 12/2013 | Gerlach | |
| 2014/0010254 A1 | 1/2014 | Wang et al. | |
| 2014/0092565 A1 * | 4/2014 | Nakashima et al. | 361/748 |
| 2014/0112363 A1 * | 4/2014 | Feitisch et al. | 372/43.01 |

OTHER PUBLICATIONS

V. Bardinal et al., "CollectiveMicro-Optics Technologies for VCSEL Photonic Integration", Advances in Optical Technologies vol. 2011, Article ID 609643, pp. 1-11, Hindawi Publishing Corporation.

* cited by examiner

VCSEL PACKAGING

CROSS REFERENCE TO RELATED APPLICATION

This application claims priority benefit from the U.S. Provisional Patent Application No. 61/876,302 filed on Sep. 11, 2013, the contents of which is being incorporated by reference in their entirety.

BACKGROUND OF THE INVENTION

1. Field of Invention

The present invention relates to packaging of VCSELs and in particular to large size arrays of VCSELs on submounts and/or on printed circuit boards with other electronic components including current drivers, optical and electronic sensor systems, data storage and data processors, to incorporate multiple functionalities to achieve high optical power illumination, irradiation 2 and 3-dimensional imaging and 3-dimensional (3-D) printing systems.

2. Related Background Art

In the last few years lasers, and more especially VCSELs and VCSEL arrays, have found applications as sources for optical systems for high power illumination for general illumination, optical pumps for lasers and amplifiers, display and imaging applications, and medical applications just to name a few. The low divergence properties of lasers provide highly directional illumination suitable for high levels of illumination at great distances. The highly directional illumination also results in high brightness and high power density for optical pumping for lasers, amplifiers even in very narrow wavelength band for applications in a wide wavelength range. Visible and Infrared illumination can be obtained in a very narrow wavelength band allowing optical filtering for sensitive discrimination against background noise and efficient optical pumping of narrow spectral absorption bands. Also short pulsed illumination may be obtained for LIDAR type applications and for time domain distance discrimination applications such as seeing through fog, for motion and gesture detection.

VCSELs, either single device or in arrays, can be packaged to construct optical modules that are operated using external electronic circuits to provide operation and control functions, it is more practical to include electronic functions such as, device control, data transfer & processing, storage and analysis in the same package for operational ease and compactness. In the U.S. Pat. No. 5,708,280 issued on Jan. 14, 1998 to Lebby et al., describes a simple optical module including a plurality of Light Emitting Diodes (LEDs) and at least one VCSEL mounted on two opposite sides of a substrate together with an additional substrate to include electronic circuits for driving the optical components.

In another U.S. Pat. No. 6,816,523 issued on Nov. 9, 2004, to Glenn et al, multi-level, multi-cavity VCSEL packaging incorporating VCSELs and sensors is described. According to the description therein, the sensor is provided mainly for controlling driver current to the VCSELs for constant output power. The package is adaptable for Land Grid Array (LGA), Ball Grid Array (BGA) and Leadless Chip Carrier (LCC) for surface mounting. In a different approach, standard ASIC packaging is adapted for VCSEL packaging as has been described in the U.S. Pat. No. 6,922,496 issued on Jul. 26, 2005 to Morris. In the U.S. Pat. No. 7,049,704 issued on May 26, 2006 to Chakravorty et al. a flip-chip packaging is described for VCSELs in order to facilitate surface mounting.

Another trend in VCSEL packaging has been towards integrating various optoelectronic (OE) functions on the same side of the wafer using via connections at a wafer level, testing performance of individual functional modules before dicing. Such an approach has been described in the U.S. Pat. No. 5,300,540 issued on Mar. 19, 1996 to Jewell et al. One common element in all the methods referred above is that existing commonly utilized electronic packaging methods are adapted to incorporate VCSELs to extend it to OE functions.

One important aspect of packaging VCSELs is heat dissipation which requires particular attention for VCSEL arrays designed for high output optical power. In United States Patent Application publication No. 2004/0256630 published on Dec. 23, 2004 by Cao a thermal submount is described for additional heat dissipation capability is described. Using thermal submount is also described in the co-owned United State Patent Application Publication No. 2013/0163627 on Jun. 27, 2013, by Seurin et al. as well as in the U.S. Pat. No. 8,675,706 issued on Mar. 14, 2014, to Seurin et al. and assigned to the Assignee of this application. Both the methods may be adapted for wafer level processing. It may be noted that the thermal submount may also be adapted for incorporating other optical devices for example, a photodetector a sensor, and other electronic components with VCSELs, and is described in the U.S. Pat. No. 6,853,007 on Feb. 8, 2005, to Tatum et al., and in the co-owned U.S. Pat. No. 8,675,706 issued on Mar. 14, 2014, to Seurin et al.

In some OE packaging, optical beam shaping elements are integrated with basic OE functions. In a non-patent literature publication by Angelique Rissons and Jean-Claude Mollier entitled "The Vertical-Cavity Surface Emitting Laser (VCSEL) and Electrical Access Contribution" in Optoelectronics—Devices and Applications, Edited by Prof. P. Predeep, ISBN 978-953-307-576-1, pp. 227-254, published online in www.intechopen.com., published in print edition in October, 2011, simple lenses are integrated with VCSEL packaging to achieve a desired optical output beam shape. Integrated or external optical components are also used with VCSELs to obtain a desired optical profile in an optical illuminator and several examples have been described in co-owned U.S. Pat. No. 6,888,871 issued on May 3, 2005 to Zhang et al., and U.S. Pat. No. 8,675,706 issued on Mar. 14, 2014, to Seurin et al.

For high output power optical modules, it is extremely important that the thermal contact between the VCSEL device and the mounting platform such as a printed circuit/wiring board, a thermal submount or a heat sink is free of flux or air voids. While this can be achieved in many ways, a method particularly suited for a flux-less soldering process for VCSELs is described in the U.S. Pat. No. 4,921,157 issued on May 1, 1990 to Dishon et al. One advantage of this method is that no post soldering process to remove excess flux is needed. In a different approach described in the U.S. Pat. No. 6,601,753 issued on Aug. 5, 2003, to Baker et al. a method to expel air is described where pressure or force is applied on the chip while soldering. In a different approach soldering in an inert or reducing atmosphere is suggested.

While several of the commonly known methods used for packaging electronic components including integrated circuits (ICs) may be adapted for packaging VCSELs and VCSEL arrays or VCSEL array chips with or without additional electronic components, applying the same methods to large size VCSEL arrays ranging from several millimeters to a centimeter in linear dimensions, is still challenging. One particular problem arises from the fact that it is difficult to maintain a large size chip flat during the packaging process. This problem is particularly a challenge when the VCSEL chip is made thin or ultra-thin for better heat dissipation, and tends to warp. Furthermore, different parts of the VCSEL chip may warp differently and require different pressure or force while packaging. This application addresses some of the issues that are specific to large area VCSEL arrays.

SUMMARY OF THE INVENTION

A process for packaging of VCSEL devices including VCSEL and VCSEL array provided that is particularly suitable for large area VCSEL array chips. In one embodiment VCSEL arrays with one or more electronic components for example, drive electronics, sensors, controllers, data storage and processing to name a few, are integrated on printed circuit board (PCB) with surface mount technology. The method may be adaptable for high power optical modules. In a variant embodiment a submount suitable for efficient heat dissipation is used to mount the VCSEL device prior to integration with electronic components on a PCB.

In one aspect of the invention VCSEL chip and particularly VCSEL chip having a large area surface is tested for optical flatness prior to packaging. In a preferred embodiment flatness of a VCSEL chip is determined using optical methods. In one preferred embodiment VCSEL surface is illuminated using a low power laser at a fixed angle. Variation in the angle of reflection indicates warping of the surface. The method is particularly suited for large surface area and/or small thickness VCSEL arrays.

In another aspect of the invention a pre-determined amount of pressure or force is applied on the chip surface to flatten the chip prior to packaging. According to a different aspect of the invention a VCSEL chip is subjected to different amount of pressure or force on different areas for ensuring flatness.

One aspect of the invention is to package the VCSEL device in a controlled environment to ensure flux-less soldering. Controlled environment may include a vacuum or an inert or reducing environment.

In one aspect of the invention a packaging apparatus includes multiple elements to align the VCSEL with other electronic components to respective contact pads on the common mount such as a PCB, in the packaging apparatus including a port that can be connected to a vacuum pump or to a gas source to introduce different gases for flux less soldering.

In one aspect of the invention VCSELs and VCSEL arrays with top and bottom contacts are bonded and electrically connected to submounts or directly to printed circuit boards. The submounts and printed circuit boards include contact pads for the VCSEL contacts and for wire bonds or other types of bonds for connecting the top contact to the submount. The submount pads are electrically connected to soldering pads nearer the periphery of the submount which are used for bonding and contacting to corresponding pads on printed circuit boards.

The soldering processes for the VCSELs and arrays in the invention include fluxless vacuum soldering processes for significantly improved thermal and electrical performance. The mechanical configuration for this invention of the VCSEL arrays on submounts and contact bonding to the printed circuit board enable bonding of a temperature control or cooling device to the submount or printed circuit board resulting in efficient cooling or temperature control of the VCSEL array.

BRIEF DESCRIPTION OF THE DRAWINGS

A broad framework of the invention is presented using different embodiments described in the specification which will be better understood in conjunction with the drawing figures in which.

DETAILED DESCRIPTION

Different aspects of packaging VCSELs for incorporating them in functional modules with or without additional electronic components will be described using illustrations and explanations. One important aspect of this invention is to incorporate means and methods for integrating optical modules with electronic components in a packaging process to ensure that the VCSEL devices (individual and/or arrays) and in particular, VCSEL devices having a large area array are optically flat. The method is particularly suited for applications where it is necessary to ensure that all VCSELs in an array emit not only in the same direction but also at a substantially same angle in reference with a normal to the emission surface and will be elaborated later.

Each illustration includes only a few aspects to explain the basic concepts of the invention. However, within a broad framework of the invention different aspects from different illustrations may be combined or practiced separately to design OE systems suitable for different applications. Many variations of the steps and the order in which they are performed to package a VCSEL device may be apparent to those skilled in the art, should not be considered precluded from the basic framework of the invention.

The principles of this invention may be applied to construct a wide range of optical modules that are applicable in different optoelectronic (OE) systems. The modular aspect of the designs is particularly attractive for expansion and addition of new functionalities suited for different applications in a dynamic fashion and with relative ease. Many applications such as, optical pump for solid state lasers, optical illuminator, fiber lasers and amplifiers, touch screen sensor, and 3-D sensing and imaging to name just a few, where this invention may be practiced are described in United States Patents and United States Patent applications respectively, U.S. Pat. No. 8,576,885 issued on Nov. 5, 2013 to van Leeuwen et al, U.S. Pat. No. 8,675,706 issued on Mar. 18, 2014 to Seurin et al, U.S. Pat. No. 8,783,893 issued on Jul. 22, 2014 to Seurin et al, Ser. No. 13/783,172 on Mar. 1, 2013 by Seurin et al, Ser. No. 14/085,775 on Nov. 20, 2013 by Ghosh et al and Ser. No. 14/303,161 on Jun. 12, 2014, by Ghosh et al., all co-owned by the Assignee of this application.

Figure 1:
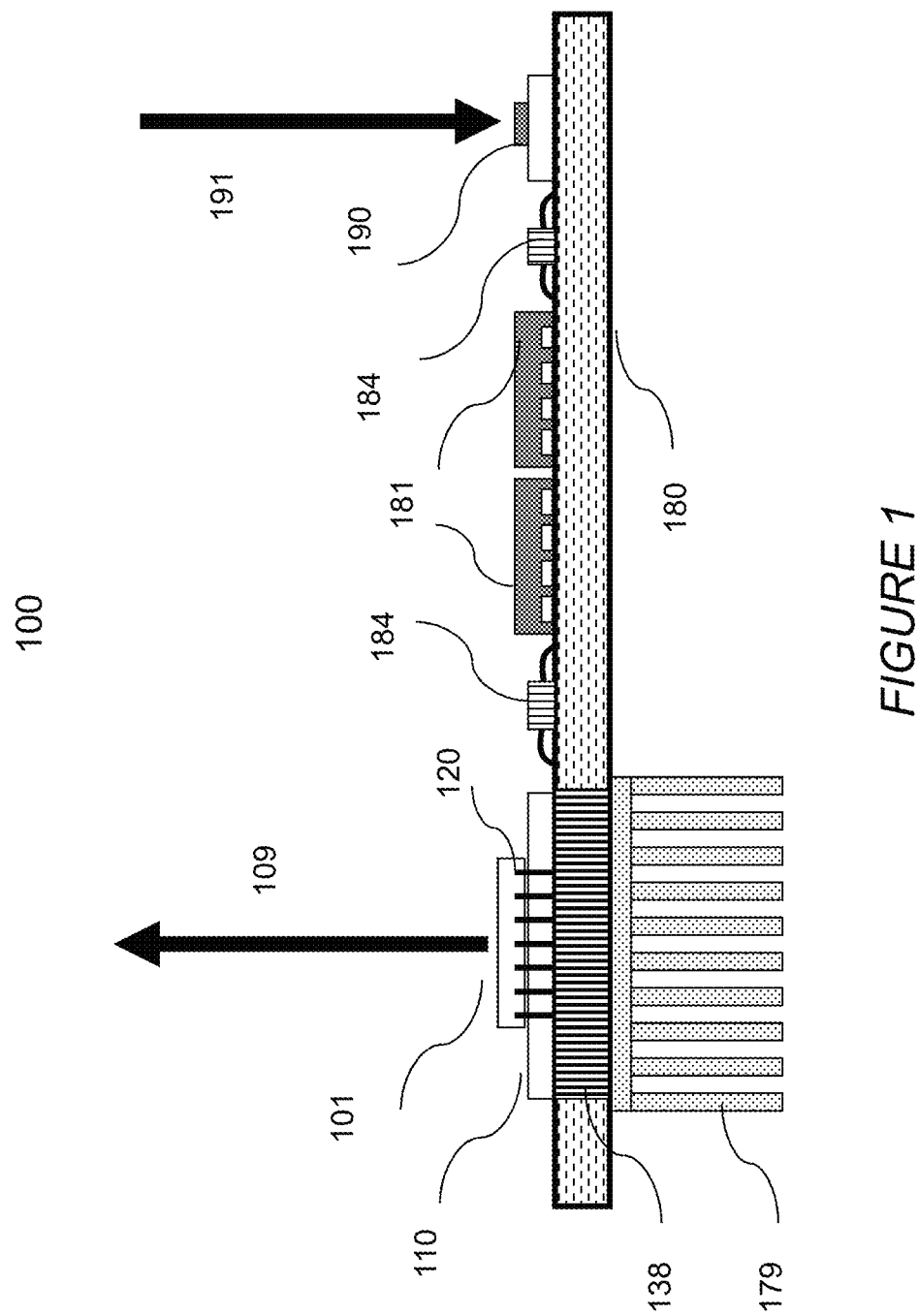
FIG. 1 represents an exemplary optoelectronic (OE) system where the invention may be practiced.

OE System Configuration:

A generic OE system where the invention may be practiced is schematically shown in FIG. 1. More specifically, an OE module 100 comprises an optical module 101, more specifically an emitter including a VCSEL array disposed on a submount 110 which in turn is soldered or bonded to a printed circuit board (PCB) 180. For the purpose of discussion PCB includes all types of generic or customized wiring boards in a way generally known in the art. Any type of VCSEL devices (including a single device, an array of VCSELs or VCSEL array chip) described in co-owned United States Patent Application Publication No. 2013/0163627 on Jun. 27, 2013 by Seurin et al., and U.S. Pat. No. 8,675,706 issued on Mar. 18, 2014 to Seurin et al. is equally suitable. That description is being incorporated by reference in its entirety.

In one aspect of the invention the optical module may be pre-fabricated in pre-determined size and optical output power for different application and will be described later. Each OE module may include one or more optical modules which may be substantially similar or different as required by the specific application. It should be understood that a VCSEL device may also be directly soldered or bonded to the printed circuit board (PCB) for low output power applications and has been widely described in prior art patent and non-patent literature.

For high output power applications, a module including a submount, and in particular a thermal submount is a preferred choice for better adaptability to a large range of heat dissipation devices and are described in the U.S. Pat. No. 8,675,706 issued on Mar. 18, 2014 to Seurin et al. That description is being incorporated by reference in its entirety. More specifically, the VCSEL array emission surface is positioned distal to the submount surface that is in contact with the PCB as in the example shown in FIG. 1. Different types of submounts, including a thermal submount have earlier been described in the co-owned United States Patent Application Publication No. 2013/0163627 on Jun. 27, 2013 by Seurin et. al., the contents of which is being incorporated by reference in its entirety.

One or more electronic components for example integrated circuit(s), 181 or other active or passive components 184, are co-located on the PCB and are connected to the VCSEL device for providing a variety of functions according to specific application a module is intended for. Electrical connections between various optical and electrical components made through contact pads and traces that may be general purpose pre-designed connections, or preferably customized for a particular application. For example, the integrated circuit may include a high speed programmable current driver and a processor to configure a programmable optical illuminator dynamically. Other combinations and sub-combinations that may occur to those skilled in the art are equally applicable.

The PCB may include an optional thermal conducting region 138 such that the submount is in direct contact with a heat sink 179 located on a side of the PCB that is opposite to the submount. An optical sensor assembly 190 may optionally be mounted on the PCB. The optical sensor may just be a single photodetector or a plurality of photodetectors in a linear or a two dimensional array and may be used as a sensor for a variety of functions, such as to provide feedback for controlling drive current to VCSEL arrays or individually addressable VCSEL devices using a pre-programmed desired illumination sequence to create or dynamically alter, a structured illumination source for a 3-D imaging apparatus (please see co-owned U.S. patent application Ser. No. 14/303,161 filed on Jun. 12, 2014, by Ghosh et al).

The optical module as described in reference with FIG. 1 may be constructed in many different ways depending upon specific requirement or a particular application. A few representative examples of optical modules that are particularly suitable for high output power applications are shown in FIGS. 2a, 2c-2f. Elements that are identical or provide comparable functionality are shown with same reference numeral. Description of each reference numeral will not be repeated for brevity. An optical module for a high output power in general is configured on a submount 210 comprising a thermally conducting but electrically insulating material.

Figure 2:
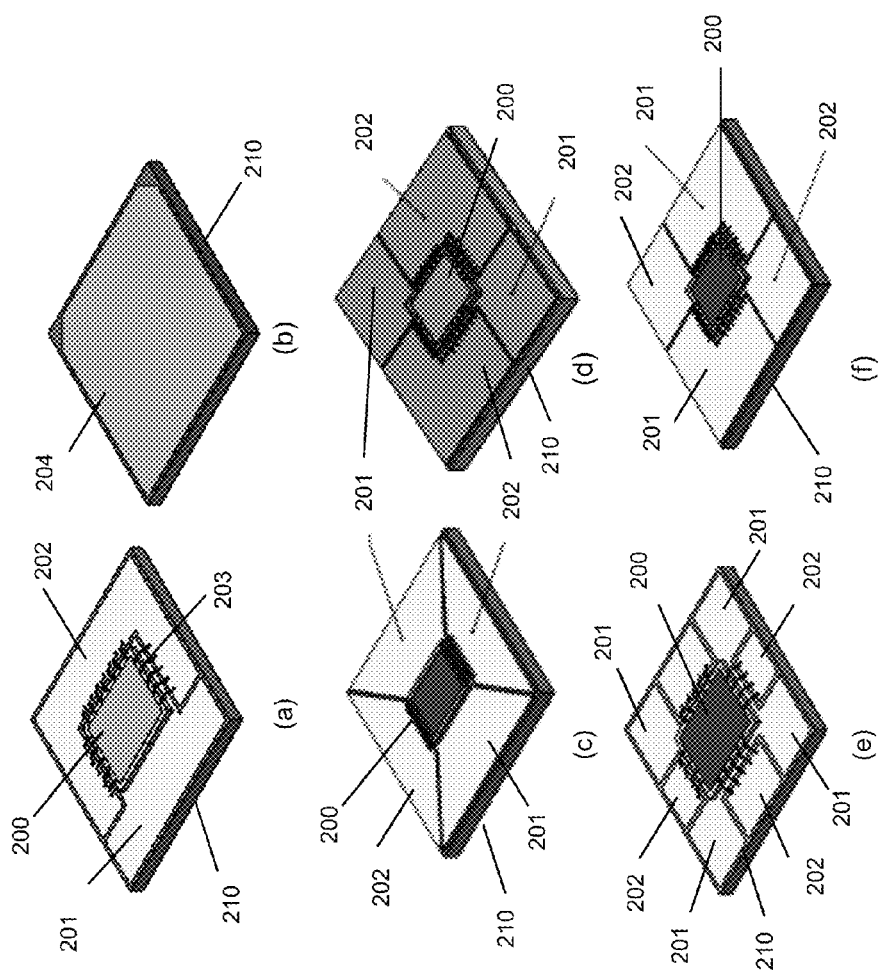
FIG. 2 shows exemplary optical modules that may be used in the OE system of FIG. 1, FIGS. 2a, 2c, 2d, 2e and 2f represent preferred configuration of the emission surface, and 2b represents the underside of the optical modules.

As shown in FIG. 2b, one side of the submount typically has an electrically conducting layer 204 readily adaptable for bonding or soldering on to a contact pad on a PCB. The opposite side generally has bonding pads to electrically connect two terminals of a VCSEL device, which in the examples shown in FIGS. 2a, 2c-2f is a VCSEL array. Some preferred structures of submount that are suited for use with external heat dissipation devices are described in a co-owned United States Patent Application Publication No. 2013/0163627 on Jun. 27, 2013 by Seurin et al., also assigned to Assignee of this application. The content of the above mentioned application is being incorporated by reference in its entirety.

The VCSEL device 200, preferably an array of VCSELs is constructed monolithically on a semiconductor material. The array may be configured as a regular array having a common array pitch (spacing between individual VCSELs) or may be in a random shape. The VCSELs are electrically connected through the semiconductor substrate as a first common electrical terminal. A second contact of each VCSEL in the array in this example, are also electrically connected together as a second common terminal of the entire array. This configuration is particularly suited for a high power optical illuminator module or for high power optical pump to pump solid state lasers (U.S. Pat. No. 8,675,706 issued on Mar. 18, 2014 to Seurin et al, U.S. Pat. No. 8,783,893 issued on Jul. 22, 2014 to Seurin et al., U.S. Pat. No. 8,576,885 issued on Nov. 5, 2013, to van Leeuwen et al.).

Referring back to FIG. 2a, the first common electrical terminal of the VCSELs is electrically accessed by soldering or bonding directly to the bonding pad (201) and by wire bonding at one or more place shown as 203 (only one labelled for clarity), the second common electrical terminal to the bonding pad 202. This configuration is particularly suited for driving the VCSEL array using high drive current in pulse mode. In the example shown in FIG. 2a, there are only two bonding pads; however, it need not be so. In other examples shown in FIG. 2c-2f, the bonding pads 201 and 202 are configured in different ways to suit specific applications, such as high speed and high drive current. The basic configuration is substantially similar to the one shown in FIG. 2a except for the shapes and sizes of the bonding pads on the submount, that are more suited for generating short pulses having fast rise time.

For example, in applications such as LIDAR, time-of-flight sensors and gesture recognition, very short optical pulses from the VCSEL array are more appropriate. The VCSEL array is inherently a very fast device. However high inductance in circuit leads and contact pads can negatively affect the rise time of the current pulse delivered to the VCSEL array which adversely affects the rise time of the optical pulse from the VCSEL array. The optical module configurations shown in FIGS. 2c-2e having multiple bonding pads are particularly suited for low inductance and high speed operation. One advantage of having multiple bonding pads on the submount is that multiple driver circuits may be connected to reduce overall inductance and facilitate high speed operation.

For example, in FIG. 2c there are two sets of bonding pads 201 and 202 on the submount. Furthermore, the bonding pads are flared outwards, to increase the area and to facilitate connecting the second electrical terminal of the VCSEL array by short length wires bonded at multiple points on the contact pads 202. This configuration is particularly suited to reduce inductance to facilitate high speed operation of the VCSELs. Other ways of achieving the same objective are shown in FIGS. 2d and 2e. More specifically, in FIG. 2d two sets of bonding pads 201 and 202 are located on opposite corners. The second common terminal of the VCSEL array is contacted to the bonding pad 202 from all four sides by a plurality of short bonding wires. In the example shown in FIG. 2e the bonding pads 201 and 202 are divided into four sections each, one set (201) located at four corners and the second set (202) located at the center of the submount.

In the example shown in FIG. 2f, only the second bonding pad 202 is divided into two sections, one on either side of the central bonding pad 201. The second common electrical terminal of the VCSEL array is contact on both sides of the central bonding pad 201 (for the first common terminal of the VCSEL array). In each of these examples, the underside of the submount has a conducting surface 204 (FIG. 2b) to facilitate bonding to a PCB or a heat dissipation device depending upon the application. In other embodiments, the underside of the submount may have specific sets of bonding pads corresponding to the bonding pads on the top surface for surface mounting as has been described in a co-owned and co-pending U.S. patent application Ser. No. 13/337,098 filed on Dec. 24, 2011, by Seurin et. al., the content of which is being incorporated by reference in its entirety.

The examples described above are particularly suited for optical illumination applications where all the VCSELs are configured to emit light collectively to produce high output power. In other applications a pre-determined number of VCSELs in the array may be electrically connected together to have several groups within the array. In such a configuration, each group may be electrically connected to emit collectively, and/or programmed to emit in a certain sequence. The arrays may be configured in a geometrical or in a random arrangement. Entire array or individual groups in the array may have same or different array pitch in one or more sections of the array. The variations described are just a few examples of many other possibilities that may be more suited to a particular application and may be apparent to those skilled in the art.

Figure 3:
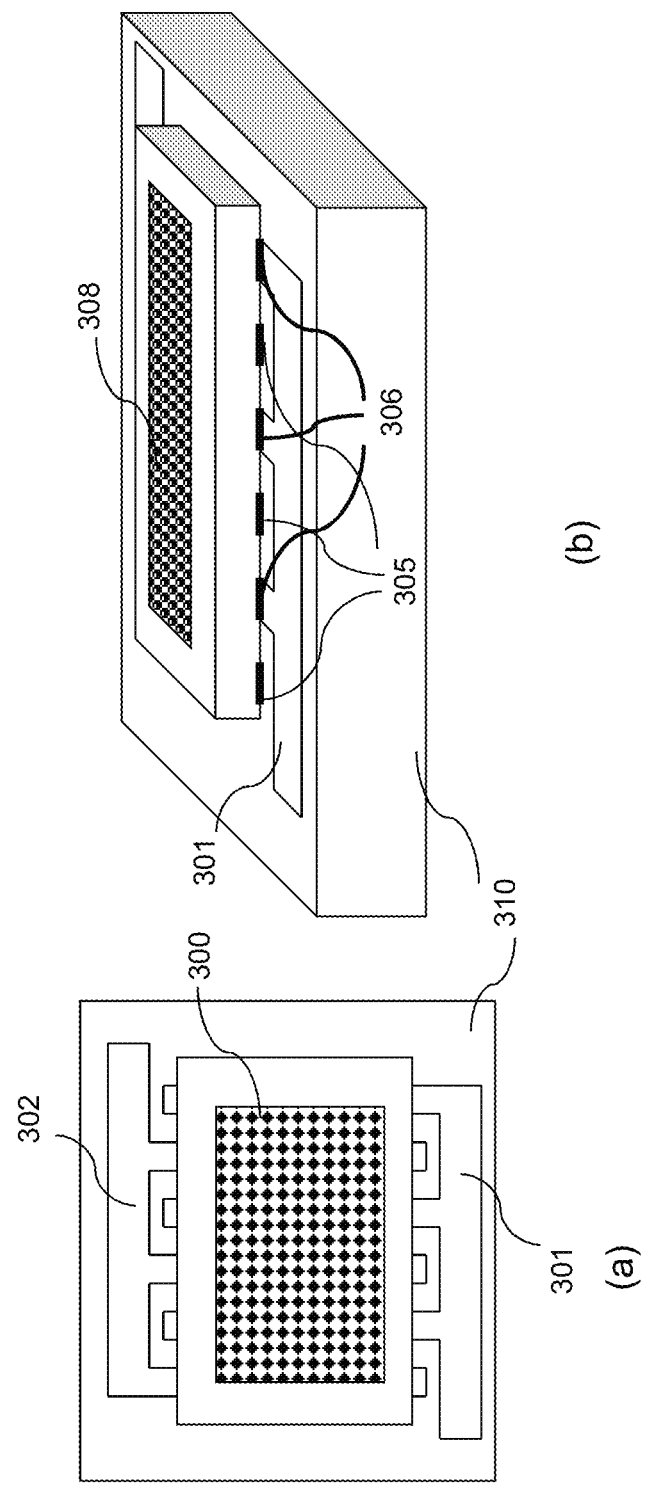
FIG. 3 represents one example of an optical module configured for surface mounting—(a) top view and (b) side view.

Examples shown in FIGS. 2a-2f are configured with the first common terminal of the VCSEL array located on the opposite side of the emission surface and the second common terminal located on the same side as the emission surface (opposite side terminals). In an alternative embodiment adaptable for surface mounting, the first and second common terminals are co-located on the same side (co-located terminals). The co-located terminals may be placed either on the same side of the emission surface or the opposite side depending upon what is convenient for a given application. This aspect is schematically shown in FIG. 3. More specifically, FIGS. 3a and 3b respectively show a top view and a side view of an optical module comprising a VCSEL array 300 bonded to one surface of a submount 310.

In both the views identical parts are labeled with the same reference numeral. Each dot represents a VCSEL device of the array 300. In this configuration the first and second common terminals of the array (not visible) are co-located on the surface distal to the emission surface (which is the top surface in reference to this figure) that are connected to the bonding pads 301 and 302, respectively, on the submount surface (not visible in FIG. 3b). In FIG. 3b shows more detail of the bonding/solder joints 305 and 306 for the two sets of registered submount pads 301 and 302, and the VCSEL array pads, respectively.

Figure 4:
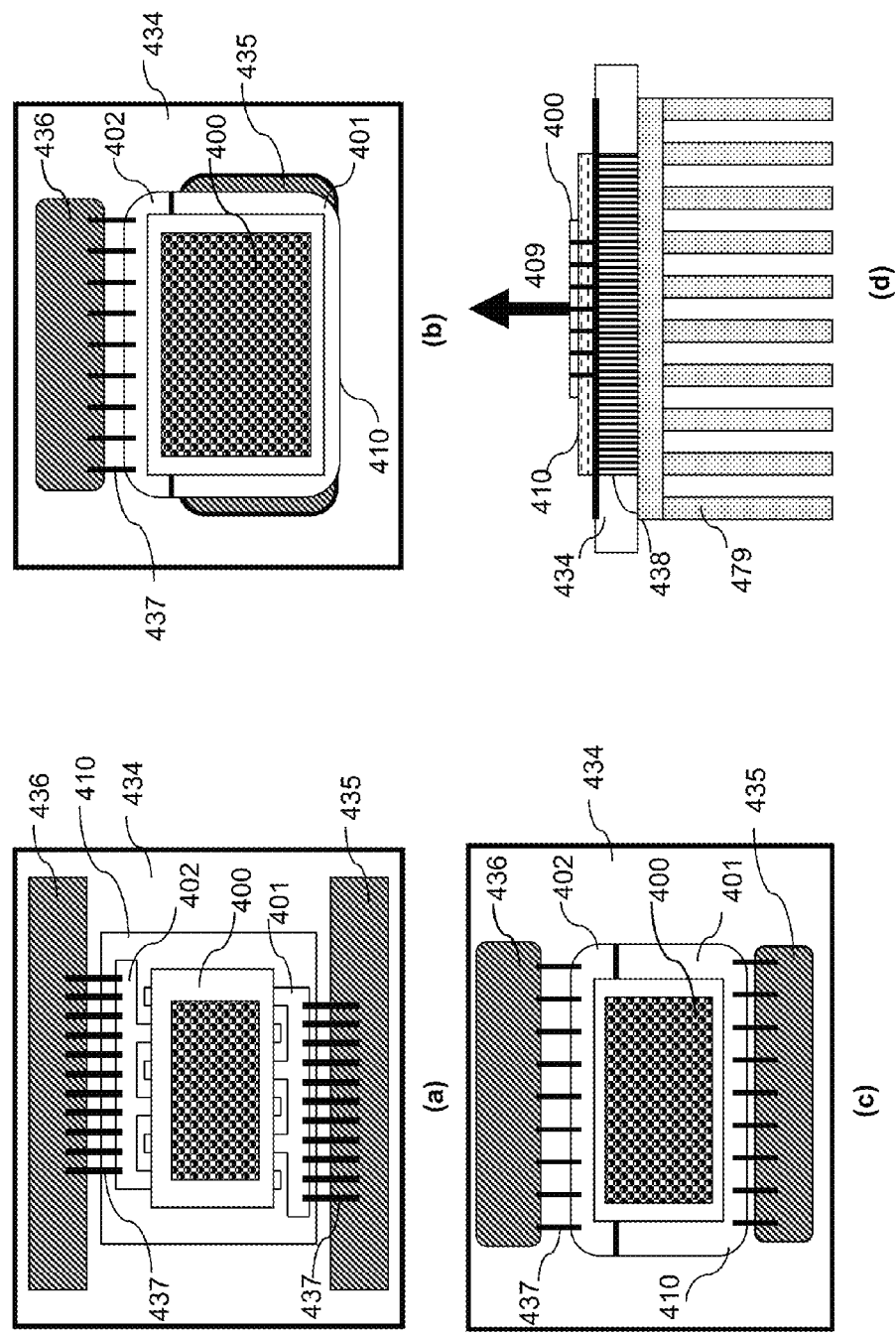
FIG. 4 shows a representative optical modules bonded to a PCB for configuring a OE system, (a) top view, (b) top view (c) top view, and side view.

The optical module adaptable for surface mounting described in reference with FIG. 3 may be applied readily in the OE system described in reference with FIG. 1. An exemplary integration of a surface mount optical module on a printed circuit board (PCB) is shown in FIG. 4. More specifically, FIGS. 4a, 4b and 4c show top views of three different configurations for bonding a submount on to a PCB, and corresponding side view is shown in FIG. 4d, respectively. Identical parts in each figure are identified with the same reference numeral and will be described once.

The optical module comprises a VCSEL array 400 configured in the surface mountable form on a submount 410. In FIG. 4a, both electrical terminals of the VCSEL array are accessible on the same surface distal to the emission surface (top surface in drawing figure), whereas in FIGS. 4b and 4c the electrical terminals of the VCSEL array is accessible on opposite sides of the emission surface. While there are many different ways to access both the terminals on the same side (emission or non-emission) a preferred method is described below.

One common electrical terminal of the VCSEL array is the common substrate and is directly bonded or soldered to a contact pad 401 of the submount. The other common electrical terminal on the emission surface of the VCSEL array is accessed on the substrate side through metal filled via holes through the semiconductor substrate and is bonded or soldered or wire bonded to the second contact pad 402 of the submount. A detailed description may be obtained in the co-owned United States Patent Application Publication No. 2013/0163627 on Jun. 27, 2013 by Seurin et al. That description is being incorporated by reference in its entirety.

In the configuration shown in FIGS. 4a and 4c, the optical module is bonded on one surface of the PCB 434 between contact pads 435 and 436 such that the submount bonding pads 401 and 402 align with a respective PCB contact pad. Electrical connections are provided between respective contact pads on PCB and the submount bonding pads using a plurality of short wire bonds 437 (only one labeled on each side for clarity) for reducing contact resistance and/or parasitic circuit elements. In the configuration shown in FIG. 4b, the bottom of the submount is directly bonded to a wide contact pad 435 on the PCB to provide electrical contact between the submount and the PCB. The other contact from the submount is connected to a second pad 436 on the PCB by short wire bonding 437. In the configuration shown in FIG. 4c, the submount is bonded to the PCB between the contact pads 435 and 436 on the PCB, similar to the embodiment shown in FIG. 4a. The bonding pads on the submount are connected to respective PCB contact pads by short wire bonding. In a preferred configuration, a current driver circuit is often co-located on the PCB and connected to the optical module through contact pads 435 and 436. Although it is not shown here, electronic components other than a current driver such as, control electronic circuits, data storage and processor units and I/O means may additionally be co-located in different parts of the PCB and connected to the optical module in many conventional ways known in the art.

In some application where heat dissipation is critical, the PCB includes an embedded high thermal conductivity region 438 for transmitting heat from the VCSEL array placed in direct thermal contact with the submount to an external cooling device 479 located on the opposite side of the PCB. While the thermal conductivity region is shown to be localized in a certain part of the PCB, it may optionally be extended to other parts or even cover the entire PCB to provide effective heat dissipation to other optical or electronic components of the OE system. Many different thermally conducting but electrically insulating PCB known in the art that work well with different types of external cooling device and is suitable for this application as well.

Figure 5:
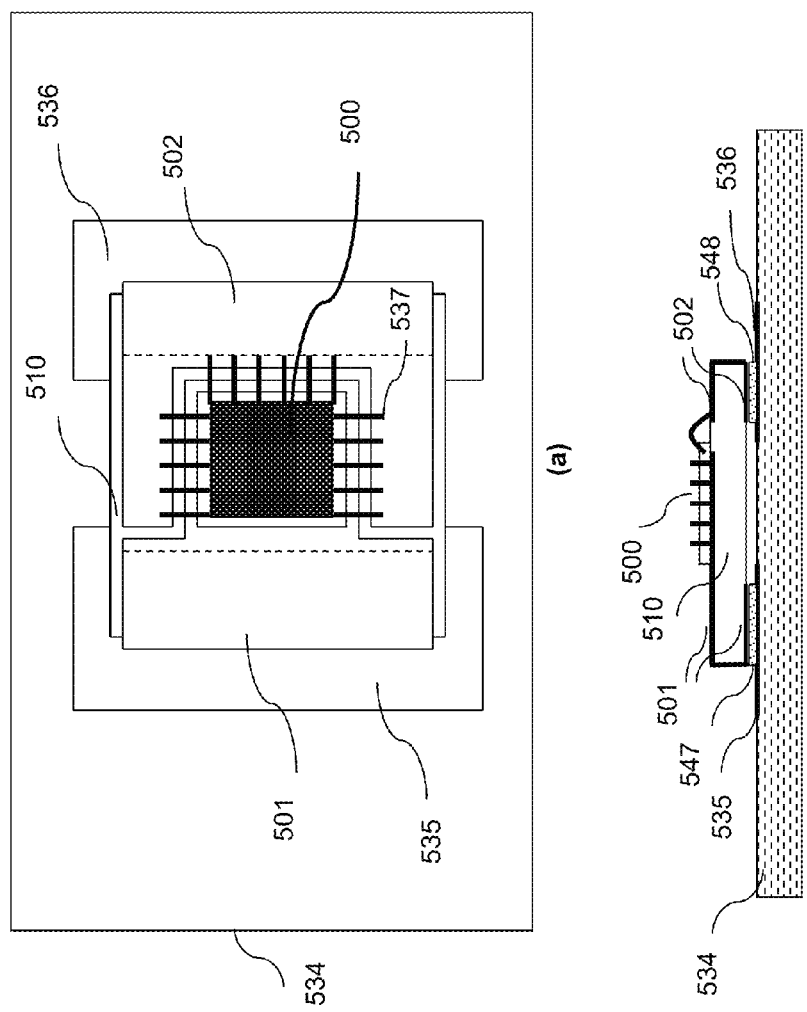
FIG. 5 shows a representative optical module with a wrap around submount to configure a OE system, (a) top view, and (b) side view.

In an alternative embodiment shown in FIG. 5, an optical module having a VCSEL array with electrical terminals located on opposite surfaces similar to the one shown in FIG. 2a is adapted for surface mounting on a PCB. More specifically, FIG. 5a schematically shows a top view of the OE system and in particular to the optical component part of the OE system. As described earlier in context with FIG. 4a, an optical module comprises a VCSEL array 500 mounted on a submount 510. The VCSEL array has a first common terminal on a surface distal to the emission surface (top surface in the context of FIG. 5) and a second common terminal on the emission surface.

In this embodiment the VCSEL array is bonded directly over a wide bonding pad 501 on the submount which extends under the VCSEL array (not visible in the top view) and electrically connects the first common terminal to the bonding pad on the submount. The second common terminal of the VCSEL array is electrically connected to a second bonding pad 502 by a plurality of short wires 537 (only one labeled for clarity).

The submount is adapted for surface mounting by extending the bonding pads 501 and 502 to the opposite surface (or underside of the submount). More specifically, the bonding pads wrap around respective edges of the submount and partially cover the opposite surface (underside) such that electrical connectivity from the bonding pads is available on the opposite surface as well. The submount is bonded to the PCB 534 by soldering such that the wrapped around portions of the bonding pads 501 and 502 extending to the opposite surface are soldered to contact pads 535 and 536, respectively, using a solder layer 547 and 548, respectively, as seen in the side view in FIG. 5b. The contact pads 535 and 536 may be additionally connected to other electronic components such as, current driver to operate the optical module. The PCB may optionally have a high thermal conducting region for providing efficient heat dissipation from the VCSEL array using an external cooling device placed in thermal contact with the PCB.

Figure 6:
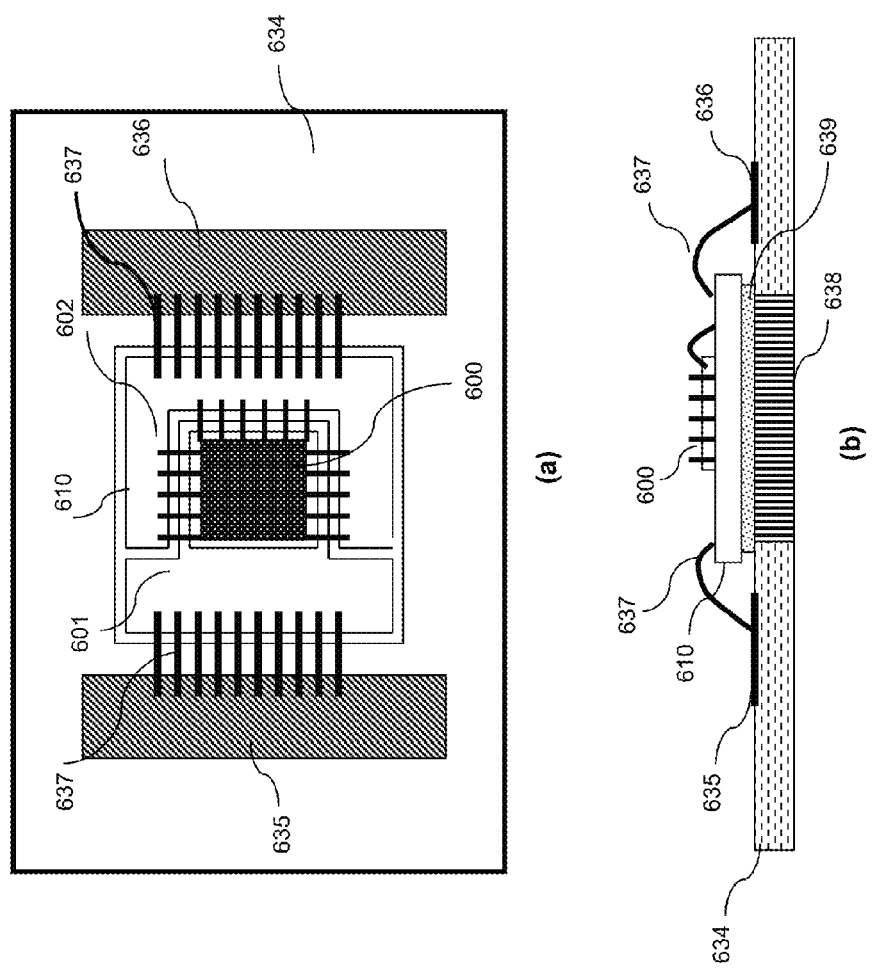
FIG. 6 schematically shows an optical module bonded to a PCB with a VCSEL array having electrical terminals located on opposite surfaces,—(a) top view and (b) side view.

In the above examples optical modules are bonded to the PCB using surface mounting technology. Optical module substantially similar to that shown in FIG. 2a may also be bonded to PCB in the absence of surface mountable contact pads. One preferred option is shown in FIG. 6. More specifically, the top view of an OE system and in particular the optical component is shown in FIG. 6a and an equivalent side view is shown in FIG. 6b to depict the features that are not visible in the top view. Referring simultaneously to FIGS. 6, 2a and 5a, the optical module is substantially similar to the one described in reference with FIG. 2a and FIG. 5a comprising a VCSEL array 600 bonded to a submount 610. That description will not be repeated. However, the submount bonding pads are not wrapped around the submount on respective edges like in FIG. 5a.

The optical module is bonded to the PCB 634 and submount bonding pads 601 and 602 respectively, are connected electrically to the PCB contact pads 635 and 636 using a plurality of short wire bonding contacts 637 (only two labeled for clarity). The printed circuit board optionally has a region of high thermal conductivity 638 preferably located under the optical module for dissipating heat from the optical module. The high thermal conductivity region is placed in thermal contact with an external cooling device for effective heat transfer. The thermally conducting region may not be necessarily localized below the VCSEL device and the whole printed circuit board may be thermally conducting to provide heat conduction to other components mounted on the printed circuit board.

It should be noted that other types of optical modules shown in FIGS. 2c-2e are equally suitable for constructing OE systems by designing the contact pads on the PCB to match the numbers, size and geometry of the bonding pads of the submount. Appropriate electrical connections between the submount bonding pads and the PCB contact pads are made by directly soldering the submount to the PCB and/or by a plurality of short wire bonding. One advantage of having multiple bonding pads connected to a terminal of the VCSEL array is that several driver circuits may be connected to the same terminal for improved high speed performance. It is noted that while only the optical component is shown on the PCB for clarity, bonding of other electronic components on the same PCB using surface mounting or wire bonding methods that are well known in the art is not precluded.

In some other application such as 3-D imaging and printing for example, where structured illumination is needed, each VCSEL in the array is configured in individually addressable mode. In such an application, one electrical contact of each VCSEL of the array is connected together in a common electrical terminal and a second electrical contact of each VCSEL is accessed individually. An OE system comprising an optical module having individually addressable VCSEL array is similar to the OE system comprising non-addressable VCSEL array optical module except for a plurality of connections to the individual VCSELs.

Figure 7:
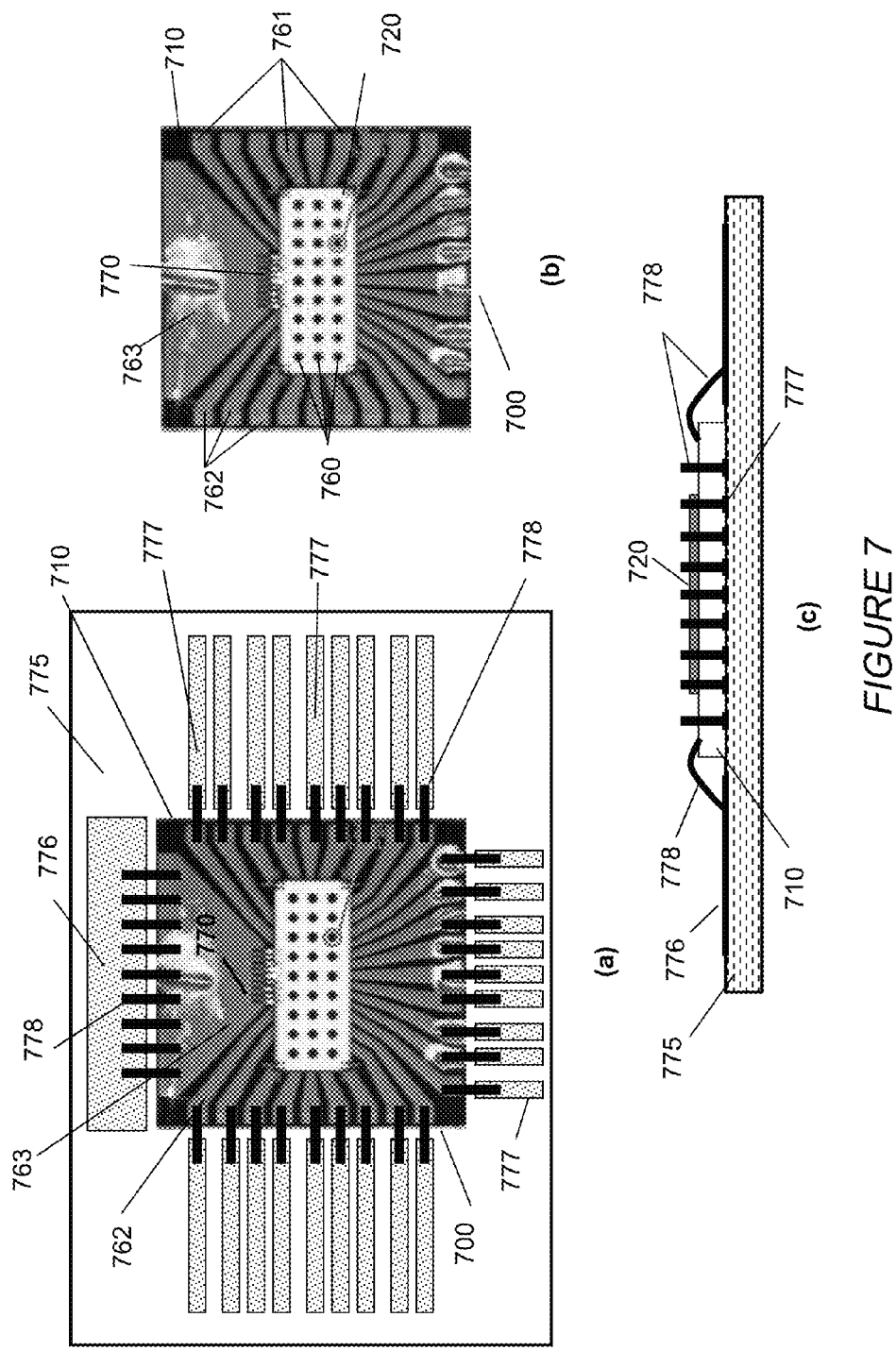
FIG. 7 schematically represents a OE system including optical module having VCSELs in an array configured for individually addressable mode.

One exemplary OE system with individually addressable VCSEL array is schematically shown in FIG. 7. More specifically, the OE system shown in the top view in FIG. 7a comprises a PCB 775 including an optical module 700 bonded to a contact pad on the PCB (not visible in this view). The PCB includes one large area contact pad 776 for the common contact and a plurality of smaller contact pads 777 (only one labeled for clarity) distributed around the periphery of the PCB so as to match with corresponding bonding pads on the optical module 700. The optical module is bonded to the PCB using a thermally conductive material, preferably on a region having an optional thermally conductive region (not shown in this view) to cool the optical module using an external cooling device (please see FIGS. 4 and 6 for more detail of this aspect).

Detail structure of an actual optical module 700 is shown in a photograph in FIG. 7b (top view). More specifically, the optical module comprises a submount 710 including a large area bonding pad 763 flared outwards to one edge of the submount, and a plurality of smaller bonding pads 761 and 762 (only few labeled for clarity) distributed around the periphery of the submount. The optical module further includes a VCSEL array 720. One common electrical terminal on the emission side of the VCSEL array is electrically connected to the wide bonding pad 763 using a plurality of short wire bonds 770 (only one labeled for clarity). Individual VCSEL devices 760 (only few labeled for clarity) in the array have separate electrical contacts on the other side of the emission surface that are electrically connected to respective individual bonding pads (e.g. 761 and 762) located around the periphery of the submount.

The wide area bonding pads 763 and the plurality of smaller bonding pads 761 and 762 on the submount are registered with the large area contact pad 776 and the plurality of individual contact pads 777 (only a few labeled for clarity) located around the periphery. Each VCSEL in electrical contact with a corresponding bonding pad on the submount is electrically connected to a contact pad on the PCB using short wire bonding 778 (only few labeled for clarity). Some aspects that are not visible in the top view in FIGS. 7a and 7b are shown in the cross section view in FIG. 7c that is also labeled with identical reference numerals.

While the individually addressable OE system is described using a VCSEL array that has individual contacts on the opposite sides of the emission surface, similar functionality may be achieved with a VCSEL array where individual contacts are made on the emission surface and the common terminal is located on the opposite surface. Accordingly, the contact pads on the PCB would have alternative positions to accommodate a simple design variation without digressing from the basic principles of constructing the optical module. In one variation, groups of pre-determined number of VCSELs in the array may be connected together to emit collectively and each group may be wired to be individually addressable. These and other variations may be apparent to those skilled in the art.

It is noted that in the above discussion, bonding of only the optical component and in particular the optical module is described in detail. However, any OE system including one shown in FIG. 1, comprise other electronic components including integrated circuits, signal processors, data processors and storage, I/O functions, and other discrete active and passive electronic components, etc. that support and supplement optical functions of the OE system. The electronic components may be connected by wire bonding or by surface mounting on the same PCB by methods that are well known in the art and will not be elaborated. In order to reduce parasitic elements, electronic components and optical module are electrically connected to share a contact pad on the PCB.

Figure 8:
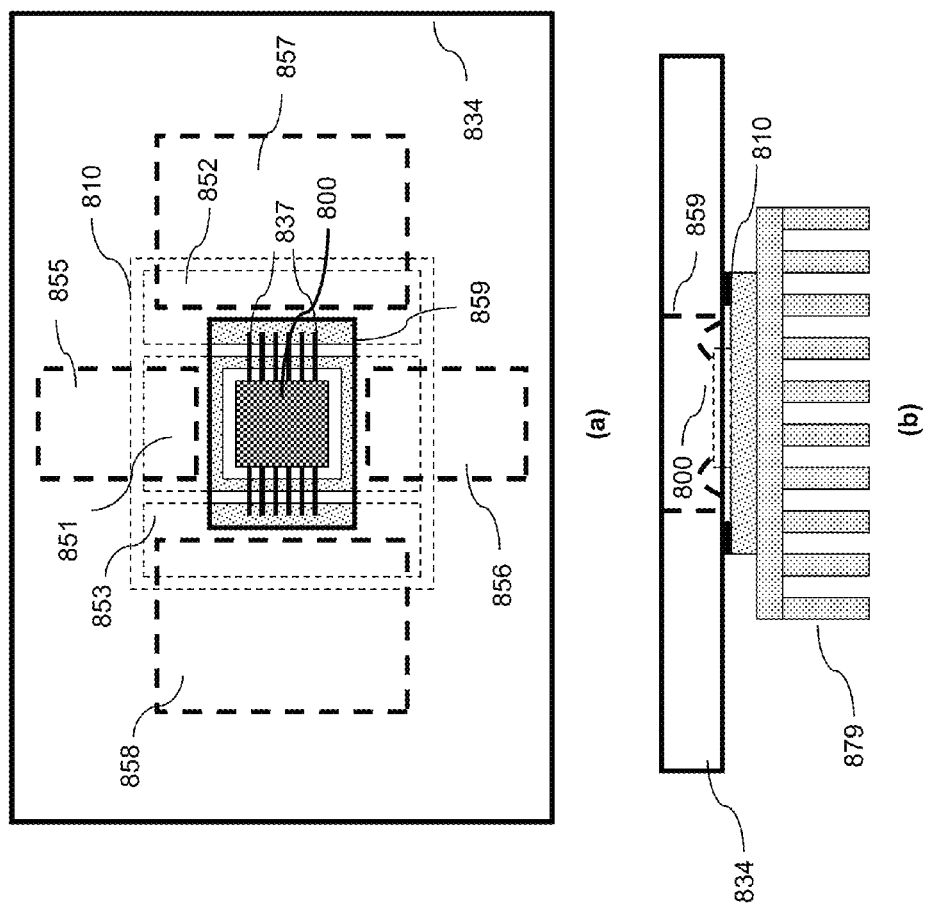
FIG. 8 shows an alternative method for configuring an optical module bonded to the underside of a PCB—(a) top view and (b) side view)

For example, a current driver and VCSEL array electrical terminal may be connected to the same contact pad on the PCB. In some variant embodiment an optical module may be connected to multiple current drivers on multiple contact pads connected to the same VCSEL array. In a different approach electronic components are disposed on multiple levels of a PCB. Often, these components are disposed on multiple levels of a PCB. In one embodiment shown in FIG. 8, an optical module is bonded on the underside of a PCB. One advantage in this configuration is that the submount with the VCSEL array may be placed in direct contact with a heat dissipation device for optimum cooling without incurring added complexity of fabricating a high thermal conductivity region and conduit in the PCB. Furthermore, short leads to the VCSEL array allows for high speed pulse operation that is beneficial for some applications for example, gesture recognition.

More specifically, FIG. 8a shows an optical module comprising a submount 810 with a VCSEL array 800 bonded to it. The emission surface of the VCSEL array faces an aperture 859 cut in the PCB for the output optical beam to be transmitted. The PCB 834 thus surrounds the VCSEL array 800 on all four sides. The submount bonding pad 851 is electrically connected to the first electrical terminal by direct soldering, whereas bonding pads 852 and 853 are electrically connected to the second electrical terminal using short wire bonding 837 (only few labeled for clarity) of the VCSEL array, respectively.

The submount bonding pad 851 extended on both sides of the center is bonded in direct contact with the PCB on the same side as the VCSEL array using two contact pads 855 and 866 over the entire length at the bottom of the submount. The bonding pads 852 and 853 on the submount are bonded to the contact pads 857 and 858 on the PCB. All contact pads 855, 856, 857 and 858 are located on the underside of the PCB. One advantage of bonding over large area contact pads is to lower inductance significantly thereby facilitating high speed and short pulse operation of the VSCELs. A further advantage of this configuration is in the improvement of structural integrity of the OE system. Furthermore, an external cooling device 879 may be placed in close contact with the submount as shown in the side view shown in FIG. 8b.

VCSEL Packaging:

There are many types of VCSEL devices that are described in the U.S. Pat. No. 6,888,871 issued on May 3, 2005, United States Patent Application Publication No. 2013/0163627 on Jun. 27, 2013, by Seurin et al., and the U.S. Pat. No. 8,675,706 issued on Mar. 18, 2014 to Seurin et al., respectively, all co-owned by Princeton Optronics Inc. Mercerville, N.J., and are being incorporated by reference in their entirety. The basic VCSEL device contains two reflectors with the gain medium in between fabricated on a semiconductor substrate.

VCSEL devices and VCSEL arrays with far more desirable optical characteristics including but not limited to, higher output power in a single mode, better wavelength stability (with temperature over longer time operation), etc., have been developed using extended cavity or external cavity VCSELs as is described in U.S. patent application Ser. No. 13/783,172, filed on Mar. 1, 2013, by Ghosh et al., and is being incorporated by reference in their entirety. The extended cavity and external cavity VCSEL devices have a basic structure very similar to the basic device except that it includes an additional third reflector to achieve some or all of the desirable characteristics mentioned earlier.

The usual and simplest configuration for VCSEL devices and in particular VCSEL arrays is to have one electrical contact on the top surface and the other electrical contact on the bottom surface. Typically, mounted on a submount by soldering the bottom electrical contact to a pad on the submount, the second electrical connection is made by wire bonding from the top contact to a second pad on the submount. An improved surface mount VCSEL device has been developed in which both contacts are located on the bottom of the device and is described in the U.S. Pat. No. 8,675,706 issued on Mar. 18, 2014 to Seurin et al., co-owned by Princeton Optronics Inc. Mercerville, N.J., and is being incorporated by reference in its entirety. This eliminates the need for the time consuming wire bonding process and results in lower cost and higher reliability.

In the following description the term VCSEL device refers to all types of VCSEL devices described above including the three mirror VCSEL devices. Processes for packaging electronic and optical components are standardized in the industry. However, one challenge in packaging a large area VCSEL array is to maintain the flatness of the VCSEL array chip during packaging. VCSEL arrays and in particular large area arrays are susceptible for warping. The problem is more serious for VCSEL arrays that are thin or ultra-thin, for example, in a device where the substrate is thinned substantially or removed completely to avoid reabsorption of the emitted radiation from the VCSEL, and/or better heat dissipation and other factors that are well known in the art.

It is well known that VCSEL emission is highly focused and directional. Therefore local thickness variation, bending or warping of the emission surface would affect directional properties such as angle of emission with respect to a nominal normal direction to the emission surface, angle of incidence and reflection to and from a surface, just to name a few. For example, lack of flatness in the optical module would be a serious challenge in assembling a three reflector VCSEL with a common third reflector for the entire array.

Figure 9:
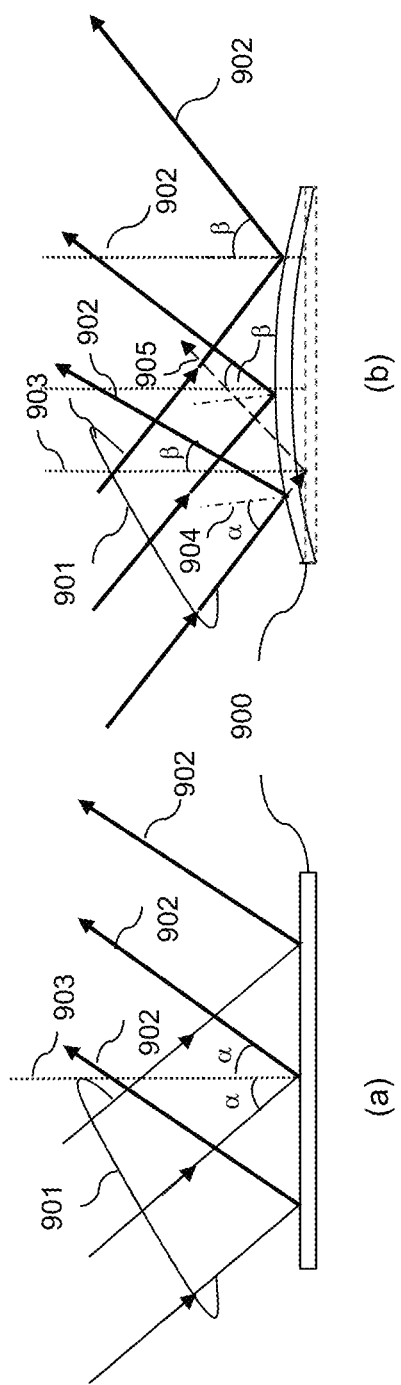
FIG. 9 schematically shows a method for evaluating flatness of a surface—(a) flat surface and (b) bent or warped surface.

Therefore it is important to ensure that the flatness of the VCSEL array or a chip is preserved when VCSELs are packaged and/or bonded to a submount or/and PCB using soldering methods preferably, a flux-less soldering method known in the art. One preferred method to measure flatness of a VCSEL array is schematically shown in FIG. 9. More specifically, FIG. 9a schematically shows a reflectivity measurement set up. A laser beam 901 (shown as plurality) is incident on a VCSEL array 900 on one surface at a fixed angle α with respect to a normal 903 perpendicular to the surface of the VCSEL which may be the emission or the non-emission surface. If the surface of the VCSEL array is flat, the reflected beam 902 is received at substantially the same angle and is detected by a photo-detector. As the incidence beam 401 moves across the surface, the reflected beam roughly maintains the same angle across the surface.

However, the VCSEL surface may not be completely flat and may show regions that are curved or warped in places depending upon the shape, size and thickness of the VCSEL array. Furthermore, different sections may have different curvature depending upon the size and shape of the VCSEL array. Such a scenario is schematically shown in FIG. 9b. The VCSEL surface 900 is curved. The dotted rectangularle represents the surface if it were flat. In that case the normal to the surface shown as a dotted line 903 would be the same at all points on the surface as in FIG. 9a and the incident beam would be reflected as a beam 905 (dashed) at the angle of incidence.

Instead, the direction of the local normal represented as a dot-dashed line 904 at the curved surface varies depending upon the curvature at each point on the surface. As the incidence beam is scanned across the surface, the reflected beam 902 is at a different angle β which may be different at different points on the surface depending upon the curvature at that point. As a result, a photo-detector placed at a fixed angle would detect low or no light. Alternatively, the angle at which the light is reflected from a curved surface may be measured to estimate the curvature and may in turn be utilized to ensure the flatness of the surface of the VCSEL array. It is noted that different regions of an array chip or a wafer (for wafer level processing) may have different curvature.

VCSELs (individual devices, arrays, VCSEL chips or entire wafer having a plurality of VCSEL arrays) are bonded to a submount or PCB using flux-less soldering in a vacuum, inert or a reducing environment to minimize solder voids (air trapped in solder joints) and/or potential oxidation of the solder resulting in pockets of dry or brittle solder regions. Significant benefits in terms of thermal and electrical performance as well as major improvements in efficiencies (defined as optical power output for a pre-determined drive current), is reported for flux-less vacuum soldering process in the art. It is noted that if the VCSEL device is not cooled effectively there is significant temperature rise resulting in a drop in output intensity and hence efficiency, for the same drive current.

Figure 10:
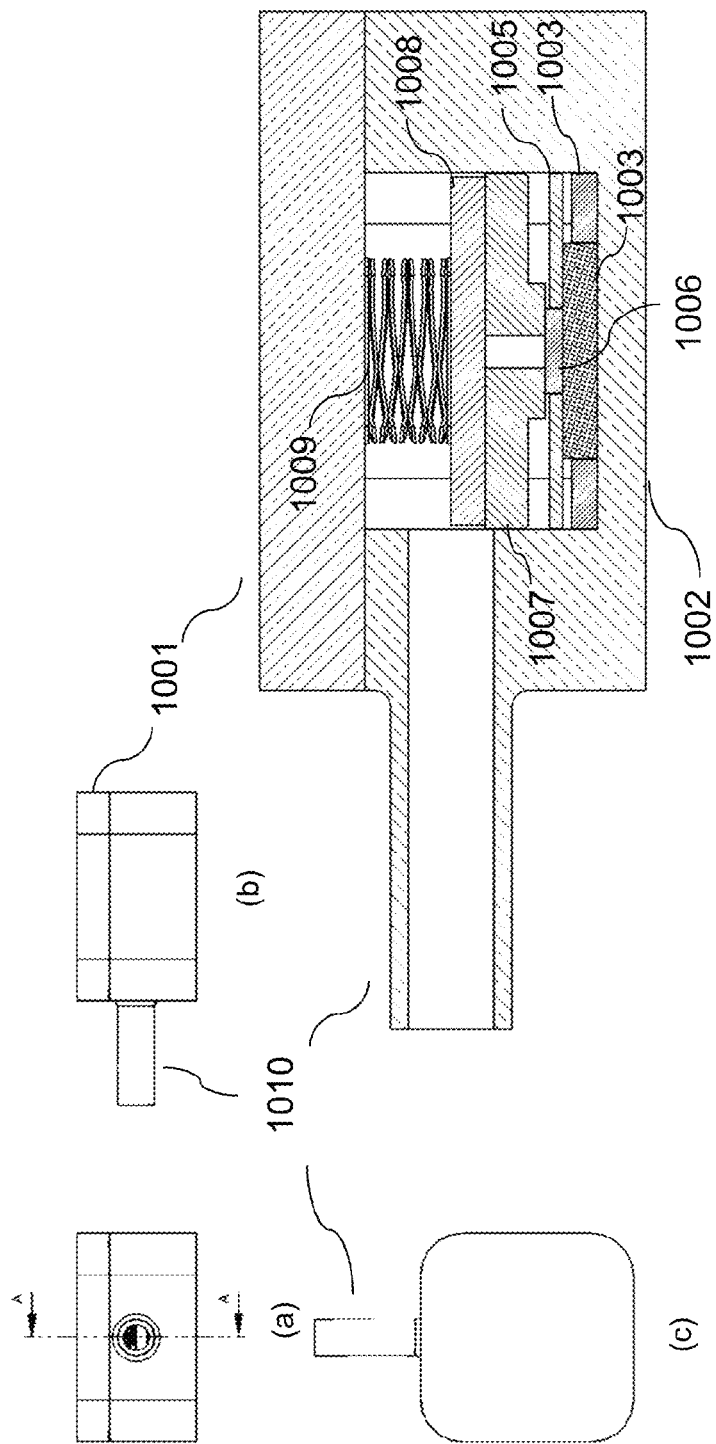
FIG. 10 is a schematic diagram of a vacuum soldering equipment.
Figure 11:
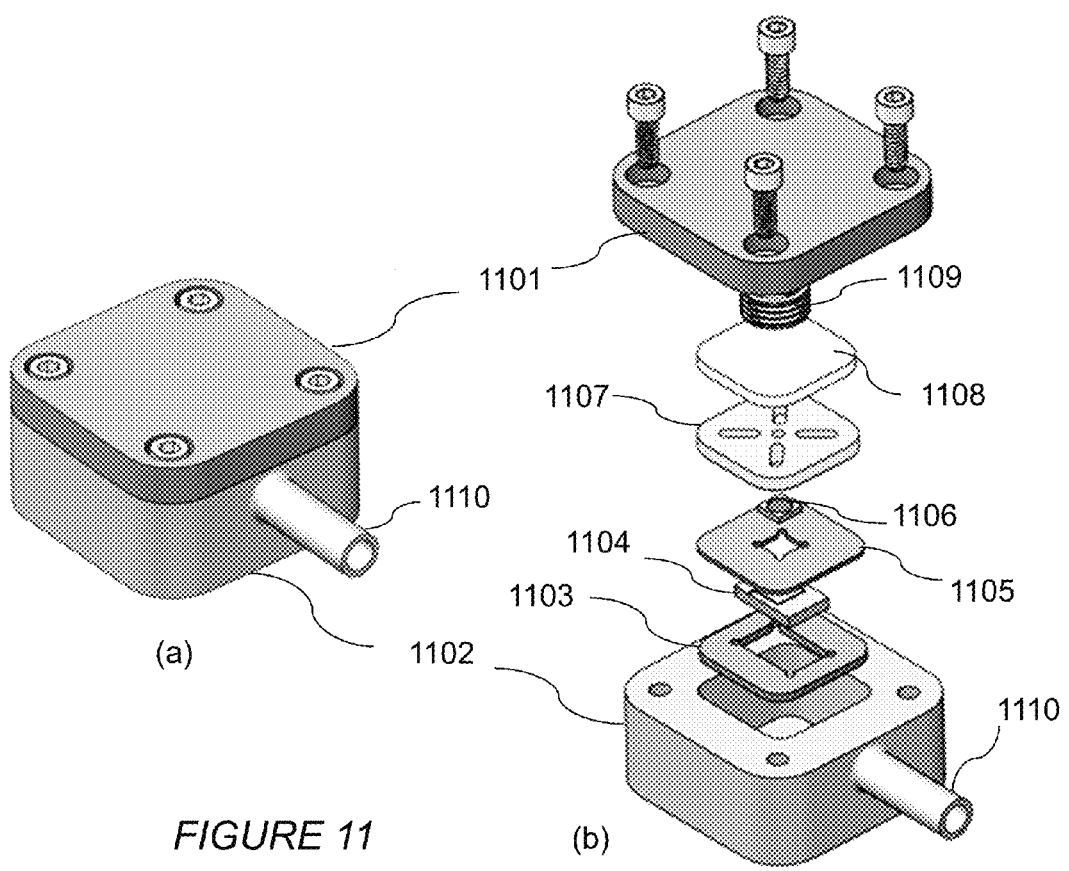
FIG. 11 shows internal parts of the vacuum soldering equipment.

In one preferred method a vacuum soldering apparatus shown in FIGS. 10 and 11 is used for flux-less soldering of VCSEL devices to submounts or PCB according to this invention. FIG. 10 shows external parts whereas FIG. 11 shows a detailed drawing of internal parts of the vacuum soldering apparatus. Same reference numerals are used to label identical parts in both the drawings and will be described with simultaneous reference to both the figures. Referring now to FIGS. 10 and 11, FIGS. 10a, 10b, 10c and 11a show side views and top views, respectively, of external features of the vacuum soldering apparatus. It is noted that the vacuum soldering apparatus shown here is only exemplary and other possible designs that may be conceived by those skilled in the art, are not precluded.

FIGS. 10d and 11b show more details of the internal parts of the vacuum soldering apparatus. More specifically, the vacuum soldering apparatus comprises a cover 1001 (1101) and a base unit 1002 (1102). The top surface of the base unit is matched to the bottom surface of the cover to close the apparatus with a vacuum sealing flange (not labeled in this drawing). A vacuum port 1010 (1110) is attached to one side of the apparatus. The vacuum port may also be used to introduce any other gas to create an inert or reducing environment if desired.

The apparatus includes an internal chamber to stack several holders that align with each other inside the chamber. In particular, a submount holder 1003 (1103) to support a submount 1004 (1104) is positioned in the chamber in the base unit. A VCSEL chip holder 1005 (1105) is positioned above the submount holder to place the VCSEL chip 1006 (1106) such that one surface of the submount is proximal to the bonding side of the VCSEL chip. Additional alignment features are included to align the contact pads of the VCSEL array to corresponding bonding pads on the submount. Solder is placed between the VCSEL pads and the corresponding submount bonding pads. The solder may be included in one of many ways such as, preforms, previously deposited on either the VCSEL pads or the submount bonding pads or both or could be a solder paste.

Depending upon the prior curvature of the chip, it may be necessary to apply pressure differentially in different regions of the chip surface that may occur due to different chip design, different manufacturing process, etc. A specially designed structured pad 1007 (1107) is provided to apply pressure differentially in certain pre-determined locations of chip surface to make it flat. It is noted that different pads may have different designs to be used for different kinds of surface deformation commonly encountered. In one specific form, the face of the pad which contacts the VCSEL chip surface is not flat but has raised regions. These raised regions are located in specific positions to apply controlled pressure on the VCSEL chip surface at specific pre-determined locations. As an example, pressure may be applied only at the edges for a VCSEL wafer that curves up at the edges. By applying the pressure in selected regions the curved wafer is forced flat during the soldering process. Weight is applied through a spring 1009 (1109) with or without a spacer 1008 (1108). Different spacers may be applied to optimize the weight applied on the VCSEL array. Alternatively, only spacers may be used without the spring for the same purpose.

Figure 12:
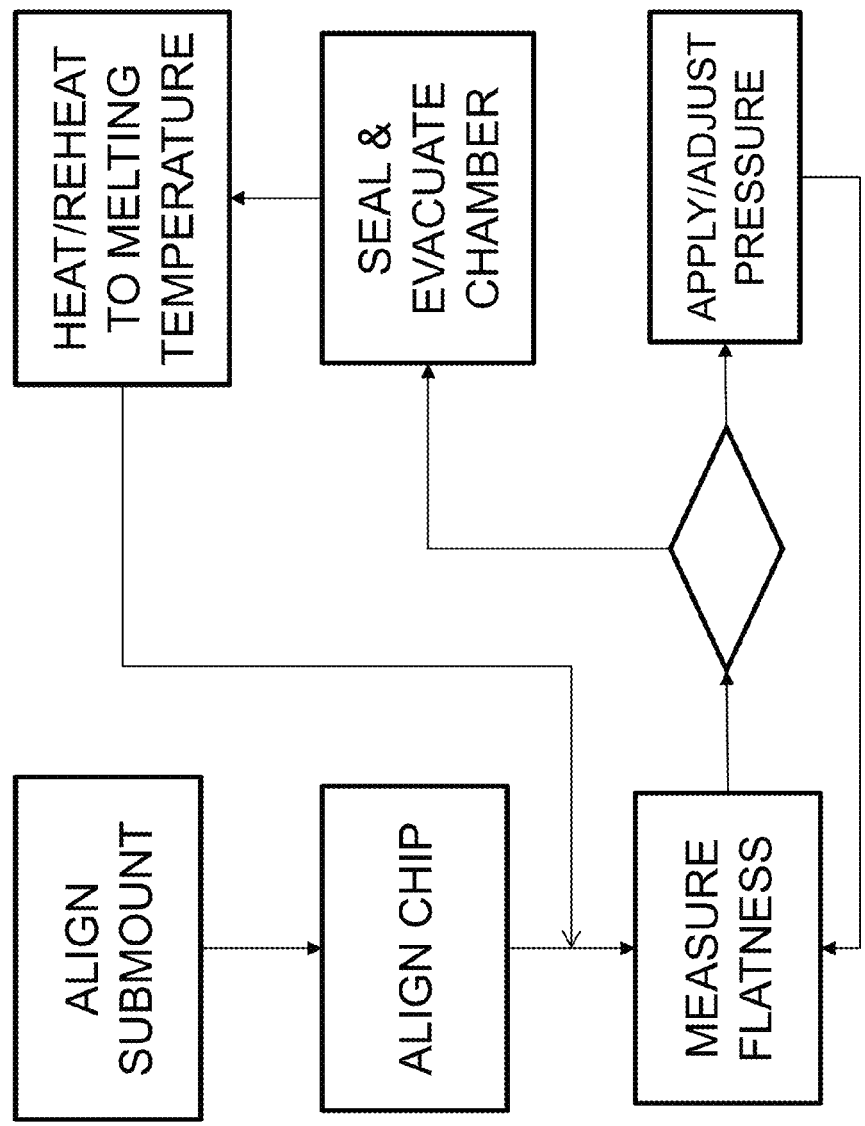
FIG. 12 shows a flow chart representing VCSEL packaging sequence.

FIG. 12 shows a flow chart representing a preferred sequence of operation for bonding a VCSEL array to a submount. A submount is first placed in a submount holder in the base unit. Alignment registers are preferably used to position the submount in the correct orientation. A VCSEL array or chip is placed in the chip holder and aligned with the alignment registers such that the contact pads on the VCSEL chip align with corresponding bonding pads on the submount. Solder is placed between the VCSEL pads and the corresponding submount bonding pads and a small amount of pressure is applied to make a soft contact between the bonding pads and the contact pads.

The VCSEL chip surface is then tested for flatness using the optical reflection measurement described earlier in reference with FIG. 9. This step is extremely important for a void-free bonding. In an iterative process weight or pressure is applied on the VCSEL chip surface and more specifically, to different parts until a desired level of flatness is achieved. The chamber is subsequently sealed for evacuating air from the chamber. If needed or specified, one or more gases can be introduced into the chamber after the chamber is free of air. The chamber is then heated to a temperature above the melting temperature of the solder allowing the solder to reflow and spread evenly. The rate of temperature rise, the time for holding above the melting point and the time for cooling down are important parameters for obtaining high quality void-free solder bonds. These parameters may optionally be optimized in a test run prior to processing a batch.

In an alternative sequence, a test run is first conducted on a sample chip from a manufacturing batch for example, to estimate the curvature of the VCSEL chip and subsequently determining the pressure required for a desired flatness by actually measuring the flatness in an iterative way as described above. VCSEL arrays are bonded and tested to evaluate performance of the bonded device. Subsequently, other VCSEL arrays from the same manufacturing batch are bonded by applying substantially the same pressure as in the test run. One advantage of the method is that it is easily adaptable for batch processing and manufacturing environment without going through extensive time consuming test procedures.

In an alternative process the soldering is performed in multiple heating cycles. For example, a flatness measurement may be used to test the flatness post soldering. If needed, a solder re-melt process is used if a post soldering flatness measurement determines that the VCSEL chip is not flat enough for a particular application. More specifically, the VCSEL still soldered to the submount is placed back in the vacuum soldering apparatus. A new combination of a structured pad and/or different weight and spring combination for providing appropriate correction is determined. The process of heating and solder re-melt is repeated until a desired quality of soldering is achieved. While the process is described for a submount, it is equally applicable to soldering a VCSEL array to a PCB.

Although a broad framework of the invention is described with reference to a preferred apparatus and method, other equivalent steps may be applied to construct an OE system having an optical module of a desired flatness. Variations and modifications of different embodiments that will be apparent to those skilled in the art are within the scope of the invention and are covered by claims.

What is claimed is:

1. A packaging process comprising the steps of:
   positioning and aligning a submount in a vacuum soldering apparatus, wherein said submount is a thermal submount, a printed circuit board or a combination thereof;
   aligning a VCSEL chip including a plurality of VCSELs, in a pre-determined reference with the submount such that a plurality of bonding pads on the submount align substantially with corresponding plurality of contact pads on the VCSEL chip;
   correcting for a curvature of the VCSEL chip surface by applying a pre-determined amount of pressure effected through a structured pad with raised regions to differentially apply controlled pressure on predetermined locations of the VCSEL chip surface to facilitate said step of correcting for the curvature;
   sealing the vacuum soldering apparatus for enclosing the submount and the VCSEL chip;
   creating an air free environment in the vacuum soldering apparatus; and
   heating the submount and the VCSEL chip in close contact thereby facilitating bonding, such that the VCSEL chip is bonded substantially flat on the submount.

2. The packaging process as in claim 1, wherein said steps of aligning is in reference with pre-determined alignment features with respect to an inner chamber of the vacuum soldering apparatus.

3. A packaging process comprising the steps of:
   positioning and aligning a submount in a vacuum soldering apparatus;
   aligning a VCSEL chip including a plurality of VCSELs, in a pre-determined reference with the submount such that a plurality of bonding pads on the submount align substantially with corresponding plurality of contact pads on the VCSEL chip;
   measuring curvature of the VCSEL chip surface, wherein said step of measuring curvature of the VCSEL chip surface is effected through measuring an angle of reflection across the VCSEL chip surface in response to a radiation incident upon said VCSEL chip surface at a fix angle;
   correcting for the curvature of the VCSEL chip surface by applying pre-determined amount of pressure;
   sealing the vacuum soldering apparatus for enclosing the submount and the VCSEL chip;
   creating an air free environment in the vacuum soldering apparatus; and
   heating the submount and the VCSEL chip in close contact thereby facilitating bonding, such that the VCSEL chip is bonded substantially flat on the submount.

4. The packaging process as in claim 1, wherein the step of applying pressure using the structured pad on the VCSEL chip surface is facilitated by one or more spacer.

5. The packaging process as in claim 1, wherein the step of applying pressure using the structured pad on the VCSEL chip surface is facilitated by a spring.

6. The packaging process as in claim 1, wherein bonding is facilitated through providing solder between plurality of bonding pads on the submount and corresponding plurality of contact pads on the VCSEL chip.

7. The packaging process as in claim 1, wherein said step of heating is performed in one or more heating cycles to facilitate an iterative process of correcting for curvature and reflow of solder between the plurality of bonding pads on the submount and corresponding plurality of contact pads on the VCSEL chip to attain a desired quality of flatness and bonding.

8. The packaging process as in claim 3, wherein said steps of measuring curvature and correcting for the curvature are performed iteratively in a test run loop to determine a set of pressure values suitable for the measured curvature of the VCSEL chip.

9. The packaging process as in claim 1, wherein air free environment is one selected from the group consisting of vacuum, inert gas and a gas providing a reducing environment.

10. A packaging process comprising the steps of:
    positioning and aligning a printed circuit board in a vacuum soldering apparatus;
    aligning a VCSEL chip including a plurality of VCSELs, in a pre-determined reference with the printed circuit board such that a plurality of contact pads on the printed circuit board align substantially with corresponding plurality of contact pads on the VCSEL chip;

measuring curvature of the surface of the VCSEL chip surface, wherein said step of measuring curvature of the VCSEL chip surface is effected through measuring an angle of reflection across the VCSEL chip surface in response to a radiation incident upon said VCSEL chip surface at a fix angle;

correcting for the curvature of the VCSEL chip surface by applying pre-determined amount of pressure;

sealing the vacuum soldering apparatus for enclosing the printed circuit board and the VCSEL chip;

creating an air free environment in the vacuum soldering apparatus; and heating the printed circuit board and the VCSEL chip in close contact thereby facilitating bonding, such that the VCSEL chip is bonded substantially flat on the submount.

11. The packaging process as in claim 10, wherein said steps of aligning is in reference with pre-determined alignment features with respect to an inner chamber of the vacuum soldering apparatus.

12. The packaging process as in claim 10, wherein the step of applying pressure on the VCSEL chip surface is facilitated by one or more spacers in conjunction with a spring.

13. The packaging process as in claim 10, wherein said step of applying pressure is further effected through a structured pad designed to apply pressure differentially on pre-determined locations of the VCSEL chip surface to facilitate said step of correcting for the curvature.

14. The packaging process as in claim 10, wherein bonding is facilitated through providing solder between plurality of bonding pads on the printed circuit board and corresponding plurality of contact pads on the VCSEL chip.

15. The packaging process as in claim 10, wherein said step of heating is performed in one or more heating cycles to facilitate an iterative process of correcting for curvature and re-flow of solder between the plurality of bonding pads on the submount and corresponding plurality of contact pads on the VCSEL chip to attain a desired quality of flatness and bonding.

16. A packaging process comprising the steps of:
positioning and aligning a printed circuit board in a vacuum soldering apparatus;

aligning a VCSEL chip including a plurality of VCSELs, in a pre-determined reference with the printed circuit board such that a plurality of contact pads on the printed circuit board align substantially with corresponding plurality of contact pads on the VCSEL chip;

measuring curvature of the surface of the VCSEL chip surface, wherein said step of measuring curvature of the VCSEL chip surface is effected through measuring an angle of reflection across the VCSEL chip surface in response to a radiation incident upon said VCSEL chip surface at a fix angle;

correcting for the curvature of the VCSEL chip surface by applying pre-determined amount of pressure, wherein said steps of measuring curvature and correcting of curvature are performed iteratively in a test run loop to determine a set of pressure values suitable for the measured curvature of the VCSEL chip surface;

sealing the vacuum soldering apparatus for enclosing the printed circuit board and the VCSEL chip;

creating an air free environment in the vacuum soldering apparatus; and heating the printed circuit board and the VCSEL chip in close contact thereby facilitating bonding, such that the VCSEL chip is bonded substantially flat on the submount.

17. The packaging process as in claim 10, wherein air free environment is one selected from the group consisting of vacuum, inert gas and a gas providing a reducing environment.

18. The packaging process as in claim 3, wherein said submount is one selected from the group consisting of a thermal submount, a printed circuit board or a combination thereof.

19. The packaging process as in claim 3, wherein said steps of aligning is in reference with pre-determined alignment features with respect to an inner chamber of the vacuum soldering apparatus.

20. The packaging process as in claim 3, wherein the step of applying pressure on the VCSEL chip surface is facilitated by one or more spacers in conjunction with a spring.

21. The packaging process as in claim 3, wherein said step of applying pressure is further effected through a structured pad designed to apply pressure differentially on pre-determined locations of the VCSEL chip surface to facilitate said step of correcting for the curvature.

22. The packaging process as in claim 3, wherein bonding is facilitated through providing solder between plurality of bonding pads on the submount and corresponding plurality of contact pads on the VCSEL chip.

23. The packaging process as in claim 3, wherein said step of heating is performed in one or more heating cycles to facilitate an iterative process of correcting for curvature and re-flow of solder between the plurality of bonding pads on the submount and corresponding plurality of contact pads on the VCSEL chip to attain a desired quality of flatness and bonding.

24. The packaging process as in claim 16, wherein said steps of aligning is in reference with pre-determined alignment features with respect to an inner chamber of the vacuum soldering apparatus.

25. The packaging process as in claim 16, wherein the step of applying pressure on the VCSEL chip surface is facilitated by one or more spacers in conjunction with a spring.

26. The packaging process as in claim 16, wherein said step of applying pressure is further effected through a structured pad designed to apply pressure differentially on pre-determined locations of the VCSEL chip surface to facilitate said step of correcting for the curvature.

27. The VCSEL packaging process as in claim 16, wherein bonding is facilitated through providing solder between plurality of bonding pads on the submount and corresponding plurality of contact pads on the VCSEL chip.

28. The VCSEL packaging process as in claim 16, wherein said step of heating is performed in one or more heating cycles to facilitate an iterative process of correcting for curvature and re-flow of solder between the plurality of bonding pads on the submount and corresponding plurality of contact pads on the VCSEL chip to attain a desired quality of flatness and bonding.

* * * * *